US011424001B2

(12) United States Patent
Fujishiro et al.

(10) Patent No.: US 11,424,001 B2
(45) Date of Patent: Aug. 23, 2022

(54) APPARATUSES, SYSTEMS, AND METHODS FOR ERROR CORRECTION

(71) Applicant: MICRON TECHNOLOGY, INC., Boise, ID (US)

(72) Inventors: Keisuke Fujishiro, Sagamihara (JP); Yoshifumi Mochida, Sagamihara (JP)

(73) Assignee: MICRON TECHNOLOGY, INC., Boise, ID (US)

( * ) Notice: Subject to any disclaimer, the term of this patent is extended or adjusted under 35 U.S.C. 154(b) by 212 days.

(21) Appl. No.: 16/785,315

(22) Filed: Feb. 7, 2020

(65) Prior Publication Data
US 2021/0249097 A1 Aug. 12, 2021

(51) Int. Cl.
*G11C 29/00* (2006.01)
*G11C 29/42* (2006.01)
*G11C 7/10* (2006.01)
*G11C 8/12* (2006.01)

(52) U.S. Cl.
CPC .............. *G11C 29/42* (2013.01); *G11C 7/106* (2013.01); *G11C 7/109* (2013.01); *G11C 8/12* (2013.01)

(58) Field of Classification Search
None
See application file for complete search history.

(56) References Cited

U.S. PATENT DOCUMENTS

| 5,488,691 | A  | * | 1/1996  | Fuoco  ................. | G06F 11/1056 |
|---|---|---|---|---|---|
|  |  |  |  |  | 714/5.11 |
| 2005/0240838 | A1 | * | 10/2005 | Iwai ....................... | G11C 29/42 |
|  |  |  |  |  | 714/718 |
| 2009/0089646 | A1 | * | 4/2009  | Hirose ................... | G11C 7/106 |
|  |  |  |  |  | 714/766 |
| 2016/0203045 | A1 | * | 7/2016  | Suzuki ............... | G06F 11/1048 |
|  |  |  |  |  | 714/764 |
| 2016/0283320 | A1 | * | 9/2016  | Motwani ............. | G06F 11/1012 |
| 2017/0046223 | A1 | * | 2/2017  | Kern ................... | G11C 11/1677 |
| 2018/0198468 | A1 | * | 7/2018  | Kim ..................... | H03M 13/158 |

* cited by examiner

Primary Examiner — Mujtaba M Chaudry
(74) Attorney, Agent, or Firm — Dorsey & Whitney LLP

(57) ABSTRACT

Apparatuses, systems, and methods for error correction. A memory device may have a number of memory cells each of which stores a bit of information. A first latch may hold the encoded bit and provide it as a write parity bit to the memory array as part of a write operation. A second latch may hold a parity bit read from the memory array and the ECC circuit may generate a command signal based on that parity bit. A multiplexer latch may hold the encoded bit and provide a syndrome bit based on the command signal and the encoded bit. The syndrome bit may indicate if there is mismatch between the parity bit and the encoded bit. The logic which handles generating the syndrome bit may be separated from the logic tree.

18 Claims, 8 Drawing Sheets

APPARATUSES, SYSTEMS, AND METHODS FOR ERROR CORRECTION

BACKGROUND

This disclosure relates generally to semiconductor devices, such as semiconductor memory devices. The semiconductor memory device may include a number of memory cells which are used to store information. The stored information may be encoded as binary data, and each memory cell may store a single bit of the information. Information may decay or change in the memory cells due to a variety of different errors, which may lead to one or more bits of incorrect information (e.g., bits with different states that the bit which was originally written) being read out from the memory device.

There may be many applications where it is useful to ensure a high fidelity of information read out from the memory. Memory devices may include error correction circuits, which may be used to determine if the information read out of the memory cells contains any errors compared to the data written into the memory cells, and may correct discovered errors.

DETAILED DESCRIPTION

Figure 1:
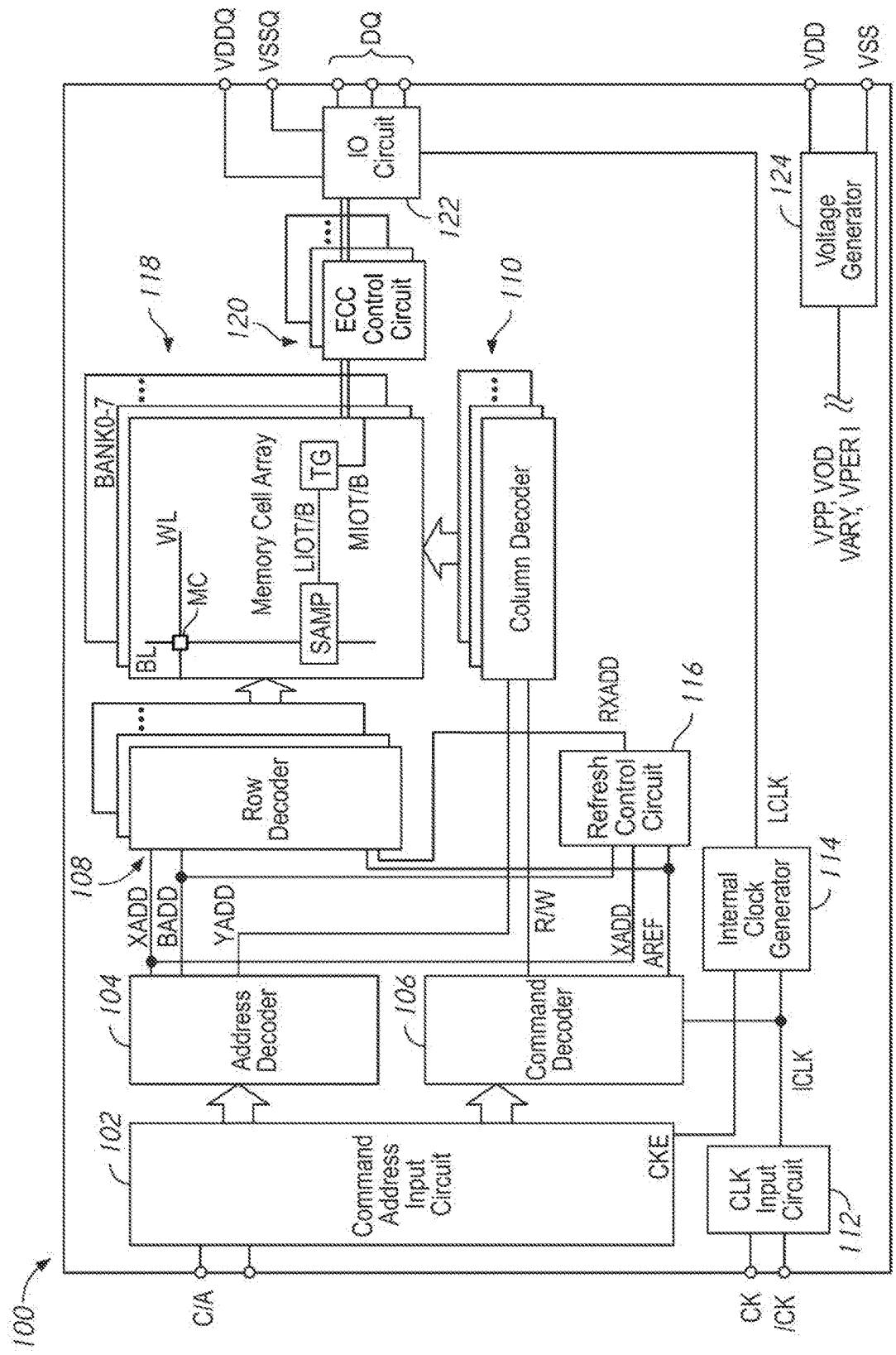
FIG. 1 is a block diagram of a semiconductor device according an embodiment of the disclosure.

The following description of certain embodiments is merely exemplary in nature and is in no way intended to limit the scope of the disclosure or its applications or uses. In the following detailed description of embodiments of the present systems and methods, reference is made to the accompanying drawings which form a part hereof, and which are shown by way of illustration specific embodiments in which the described systems and methods may be practiced. These embodiments are described in sufficient detail to enable those skilled in the art to practice presently disclosed systems and methods, and it is to be understood that other embodiments may be utilized and that structural and logical changes may be made without departing from the spirit and scope of the disclosure. Moreover, for the purpose of clarity, detailed descriptions of certain features will not be discussed when they would be apparent to those with skill in the art so as not to obscure the description of embodiments of the disclosure. The following detailed description is therefore not to be taken in a limiting sense, and the scope of the disclosure is defined only by the appended claims.

A memory device may include a memory array which has a number of memory cells, each located at the intersection of a word line (row) and digit line (column). During a read or write operation, a row may be activated, and data may be read from, or written to, the memory cells along the activated row. Each row may include memory cells which store a number of bits of data and a number of bits of parity information (e.g., data bits and parity bits), which may be used to correct up to a certain number of errors in the data bits. For example, a row may include i data bits and k parity bits, which may be used to correct up to j of the data bits. During a write operation the parity bits may be generated by an error correction code circuit based on the data written to the memory cells of the row. During a read operation the error correction code circuit may use the parity bits to determine if the read data bits are correct, and may correct any errors which are found.

An error correction code (ECC) circuit may be used to generate the parity bits based on written data during a write operation and compare the read data and read parity bits to locate errors. As part of the read operation, the ECC circuit may generate new parity bits based on the read data in a manner similar to generating the parity bits. The ECC circuit may then compare the new parity bits to the read parity bits in order to locate any errors. The process of generating the original parity bits for storage in the memory array and the new parity bits for comparison to the stored parity bits may be generally similar, the ECC may use shared circuit components for both operations. For example, the ECC circuit may include a logic tree, such as a tree of XOR gates, which may be used to combine a set of the write data or read data into a parity bit or new parity bit. When the logic tree is shared, it may be used both as part of a write operation to generate an encoded bit which may be used as (and/or used to generate a written parity bit) and it may also be used as part of a read operation to generate an encoded bit which may be used with the read parity bit to determine if there are any errors (e.g., a difference between the encoded bit and read parity bit). While sharing logic such as the logic tree may be useful for reducing a layout area or power consumption of the ECC circuit, it may be difficult to manage timing of ECC circuit operations when the components are shared.

The present disclosure is directed to apparatuses, systems, and methods for error correction. An ECC circuit may include a shared logic tree which is used for both write operations (to generate write parity bits) and read operations (to generate new parity bits for comparison to the read parity bits). The logic tree may receive data bits and generate an encoded bit. The encoded bit may be provided to a read path and a write path, which may be separate from each other. The write path may save the encoded bit to use as a write parity bit. The read path may receive a read parity bit and compare the read parity bit to the encoded bit to generate a syndrome bit, which may indicate if there is an error or not in the read data. The read parity bit may be received separate from the logic tree and the write path (e.g., the read parity bit may be received 'downstream' of the logic tree). Since the read parity bit is decoupled from the logic tree (and since the read and write paths are decoupled from each other), the generation of the encoded bit may be separated from receiving the parity bit and comparing it to the encoded bit.

For example, the read path of the ECC circuit may include a timing signal, which may be active to indicate that a syndrome bit should be provided. When the timing signal is active, read parity data stored in a latch may be compared to the encoded bit. The logic tree may receive read and write data as part of read and write operations. However, the latch which holds the read parity bit is not part of write operations. Accordingly, the latch may hold the read parity bit for as long as needed, and may not need to dump the held read parity bit when operations switch to a subsequent write operation. This may increase the timing margin of the circuit, since the data may be in the latch the whole time the timing signal is active (or a longer fraction of the time the timing signal is active).

FIG. 1 is a block diagram of a semiconductor device according an embodiment of the disclosure. The semiconductor device 100 may be a semiconductor memory device, such as a DRAM device integrated on a single semiconductor chip.

The semiconductor device 100 includes a memory array 118. The memory array 118 is shown as including a plurality of memory banks. In the embodiment of FIG. 1, the memory array 118 is shown as including eight memory banks BANK0-BANK7. More or fewer banks may be included in the memory array 118 of other embodiments. Each memory bank includes a plurality of word lines WL, a plurality of bit lines BL, and a plurality of memory cells MC arranged at intersections of the plurality of word lines WL and the plurality of bit line BL. The selection of the word line WL is performed by a row decoder 108 and the selection of the bit lines BL is performed by a column decoder 110. In the embodiment of FIG. 1, the row decoder 108 includes a respective row decoder for each memory bank and the column decoder 110 includes a respective column decoder for each memory bank. The bit lines BL are coupled to a respective sense amplifier (SAMP). Read data from the bit line BL is amplified by the sense amplifier SAMP, and transferred to read/write amplifiers 120 over complementary local data lines (LIOT/B), transfer gate (TG), and complementary main data lines (MIOT/B) which are coupled to an error correction code (ECC) control circuit 120. Conversely, write data outputted from the ECC control circuit 120 is transferred to the sense amplifier SAMP over the complementary main data lines MIOT/B, the transfer gate TG, and the complementary local data lines LIOT/B, and written in the memory cell MC coupled to the bit line BL.

The semiconductor device 100 may employ a plurality of external terminals that include command and address (C/A) terminals coupled to a command and address bus to receive commands and addresses, and a CS signal, clock terminals to receive clocks CK and /CK, data terminals DQ to provide data, and power supply terminals to receive power supply potentials VDD, VSS, VDDQ, and VSSQ.

The clock terminals are supplied with external clocks CK and /CK that are provided to an input circuit 112. The external clocks may be complementary. The input circuit 112 generates an internal clock ICLK based on the CK and /CK clocks. The ICLK clock is provided to the command decoder 106 and to an internal clock generator 114. The internal clock generator 114 provides various internal clocks LCLK based on the ICLK clock. The LCLK clocks may be used for timing operation of various internal circuits. The internal data clocks LCLK are provided to the input/output circuit 122 to time operation of circuits included in the input/output circuit 122, for example, to data receivers to time the receipt of write data.

The C/A terminals may be supplied with memory addresses. The memory addresses supplied to the C/A terminals are transferred, via a command/address input circuit 102, to an address decoder 104. The address decoder 104 receives the address and supplies a decoded row address XADD to the row decoder 108 and supplies a decoded column address YADD to the column decoder 110. The address decoder 104 may also supply a decoded bank address BADD, which may indicate the bank of the memory array 118 containing the decoded row address XADD and column address YADD. The C/A terminals may be supplied with commands. Examples of commands include timing commands for controlling the timing of various operations, access commands for accessing the memory, such as read commands for performing read operations and write commands for performing write operations, as well as other commands and operations. The access commands may be associated with one or more row address XADD, column address YADD, and bank address BADD to indicate the memory cell(s) to be accessed.

The commands may be provided as internal command signals to a command decoder 106 via the command/address input circuit 102. The command decoder 106 includes circuits to decode the internal command signals to generate various internal signals and commands for performing operations. For example, the command decoder 106 may provide a row command signal to select a word line and a column command signal to select a bit line.

The device 100 may receive an access command which is a read command. When a read command is received, and a bank address, a row address and a column address are timely supplied with the read command, read data is read from memory cells in the memory array 118 corresponding to the row address and column address. The read command is received by the command decoder 106, which provides internal commands so that read data from the memory array 118 is provided to the ECC control circuit 120. The read command may also cause one or more parity bits associated with the read data to be provided along the MIOT/B to the ECC control circuit 120. The ECC control circuit 120 may use the parity bits to determine if the read data includes any errors, and if any errors are detected, may correct them to generate corrected read data. The corrected read data is output to outside the device 100 from the data terminals DQ via the input/output circuit 122.

The device 100 may receive an access command which is a write command. When the write command is received, and a bank address, a row address and a column address are timely supplied with the write command, and write data is supplied through the DQ terminals to the ECC control circuit 120. The write data supplied to the data terminals DQ is written to a memory cells in the memory array 118 corresponding to the row address and column address. The write command is received by the command decoder 106, which provides internal commands so that the write data is received by data receivers in the input/output circuit 122. Write clocks may also be provided to the external clock terminals for timing the receipt of the write data by the data receivers of the input/output circuit 122. The write data is supplied via the input/output circuit 122 to the ECC control circuit 120. The ECC control circuit 120 may generate a number of parity bits based on the write data, and the write data and the parity bits may be provided to the memory array 118 to be written into the memory cells MC.

The ECC control circuit 120 may be used to ensure the fidelity of the data read from a particular group of memory cells to the data written to that group of memory cells. The device 100 may include a number of different ECC control circuits 120, each of which is responsible for a different portion of the memory cells MC of the memory array 118. For example, there may be one or more ECC control circuits 120 for each bank of the memory array 118.

Each ECC circuit 120 may include certain components which are shared between a read path and a write path, and certain components which are not shared. For example, each ECC circuit may include a logic tree, which may be a group of logic circuits coupled together to receiver a first number of data bits and provide a second number of encoded bits, where the number of encoded bits is less than the number of data bits, and the state(s) of the encoded bits are based on the states of the data bits. The logic tree may be shared between the read and write paths. Since it is shared, the logic tree may need to switch between receiving read data and write data and certain control signals and values (e.g., stored values in latches) may need to be changed. The part of the read path which receives the read parity bit may not be shared and may not need to change signals/values when the ECC circuit 120 switches between write and read operations. This may help increase a timing margin for read operations.

Each ECC control circuit 120 may receive a certain number of data bits (either from the IO circuit 122 or the memory array 118) and may use a number of parity bits based on the number of data bits to correct potential errors in the data bits. For example, as part of a write operation an ECC control circuit 120 may receive 128 bits of data from the IO circuit 122 and may generate 8 parity bits based on those 128 data bits. The 128 data bits and the 8 parity bits (e.g., 136 total bits) may be written to the memory array 118. As part of an example read operation, the ECC control circuit 120 may receive 128 data bits and 8 parity bits from the memory cell array 118. The ECC control circuit 120 may use the 8 parity bits to determine if there are any errors in the 128 read data bits, and may correct them if any are found. For example, the ECC control circuit 120 may be able to locate and correct up to one error in the 128 data bits based on the 8 parity bits. While various embodiments may be discussed with reference to ECC circuits which use 8 parity bits to find one error in 128 data bits, it should be understood that these are for explanatory purposes only, and that other numbers of data bits, error bits, and parity bits may be used in other example embodiments. An example ECC circuit is discussed in more detail in FIG. 3.

The device 100 may also receive commands causing it to carry out one or more refresh operations as part of a self-refresh mode. In some embodiments, the self-refresh mode command may be externally issued to the memory device 100. In some embodiments, the self-refresh mode command may be periodically generated by a component of the device. In some embodiments, when an external signal indicates a self-refresh entry command, the refresh signal AREF may also be activated. The refresh signal AREF may be a pulse signal which is activated when the command decoder 106 receives a signal which indicates entry to the self-refresh mode. The refresh signal AREF may be activated once immediately after command input, and thereafter may be cyclically activated at desired internal timing. The refresh signal AREF may be used to control the timing of refresh operations during the self-refresh mode. Thus, refresh operations may continue automatically. A self-refresh exit command may cause the automatic activation of the refresh signal AREF to stop and return to an IDLE state. The refresh signal AREF is supplied to the refresh control circuit 116. The refresh control circuit 116 supplies a refresh row address RXADD to the row decoder 108, which may refresh one or more wordlines WL indicated by the refresh row address RXADD.

The power supply terminals are supplied with power supply potentials VDD and VSS. The power supply potentials VDD and VSS are supplied to an internal voltage generator circuit 124. The internal voltage generator circuit 124 generates various internal potentials VPP, VOD, VARY, VPERI, and the like based on the power supply potentials VDD and VSS supplied to the power supply terminals. The internal potential VPP is mainly used in the row decoder 108, the internal potentials VOD and VARY are mainly used in the sense amplifiers SAMP included in the memory array 118, and the internal potential VPERI is used in many peripheral circuit blocks.

The power supply terminals are also supplied with power supply potentials VDDQ and VSSQ. The power supply potentials VDDQ and VSSQ are supplied to the input/output circuit 122. The power supply potentials VDDQ and VSSQ supplied to the power supply terminals may be the same potentials as the power supply potentials VDD and VSS supplied to the power supply terminals in an embodiment of the disclosure. The power supply potentials VDDQ and VSSQ supplied to the power supply terminals may be different potentials from the power supply potentials VDD and VSS supplied to the power supply terminals in another embodiment of the disclosure. The power supply potentials VDDQ and VSSQ supplied to the power supply terminals are used for the input/output circuit 122 so that power supply noise generated by the input/output circuit 122 does not propagate to the other circuit blocks.

Figure 2:
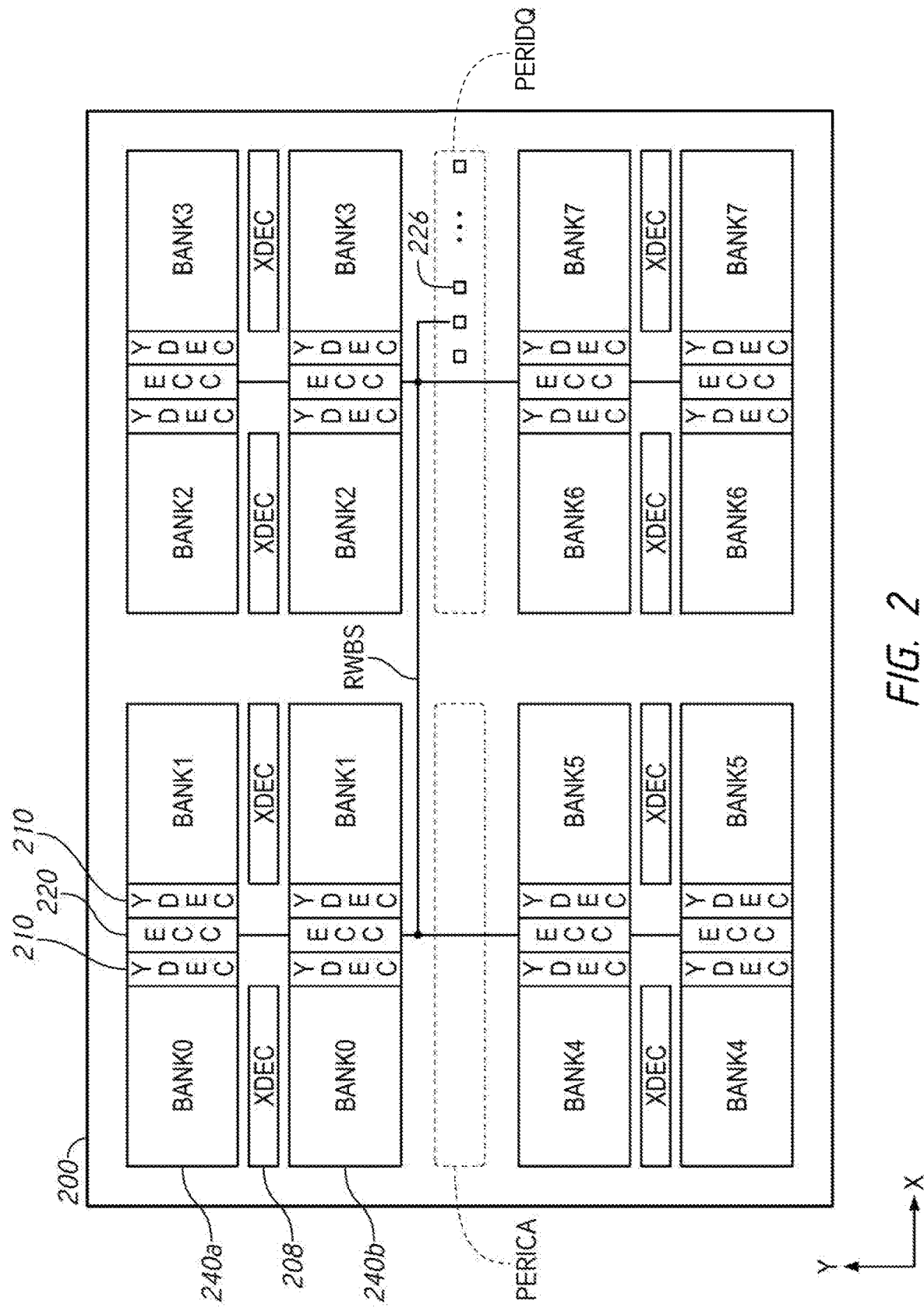
FIG. 2 is a block diagram of a memory device according to some embodiments of the present disclosure.

FIG. 2 is a block diagram of a memory device according to some embodiments of the present disclosure. The memory device 200 shows an example layout of certain components which are used as part of access operation in the memory device 200. Other components may be omitted for the sake of clarity. The memory device 200 may, in some embodiments, be included in the memory device 100 of FIG. 1.

The memory device 200 includes a number of banks 240, which are part of a memory array. The banks 240 may be divided into a first portion 240a of the bank and a second portion 240b of the bank, with a row decoder 208 positioned between the sections. The two sections of a given bank 240 and the row decoder 208 may be arranged along a first direction (e.g., a y-axis). Each bank 240 may be separated from another bank by a column decoder 210 associated with the first bank, an error correction region 220 and a column decoder 210 associated with the second band. The banks, column decoders 210, and error correction region 220 may be laid out along a second axis (e.g., an x-axis) which is orthogonal to the first axis. The banks of the memory device 200 may be arranged in an array along the x-y plane.

There may be an error correction region 220 and column decoder 210 for each portion of a given bank 240. The error correction region 220 may be coupled to one or more DQ pads 226 (e.g., through an I/O circuit) to send and receive data outside the device 200. The DQ pads 226 (and I/O circuits etc.) may be located in a PERIDQ region between the memory banks 240, and other components of the memory device 200 (e.g., the command address input circuit) may be located in a PERICA region between the memory banks 240.

The ECC region 220 includes one or more ECC control circuits used to correct the data bits which are stored in the memory banks 240 associated with that ECC region 220. For example, each ECC region 220 may include ECC control circuits which manage the portions of the banks on either side of that ECC region 220. For example a first ECC region 220 may be associated with the portion 240a and a second ECC region 220 may be associated with the portion 240b. In some embodiments, the ECC region 220 may include an ECC control circuit which corrects the data for either of the banks associated with that ECC region 220, depending on which of the banks is active. In some embodiments, the ECC region 220 may be extended (e.g., in the y direction) and may include one or more ECC control circuits which may manage both portions (e.g., 240a and 240b) of a bank.

Figure 3:
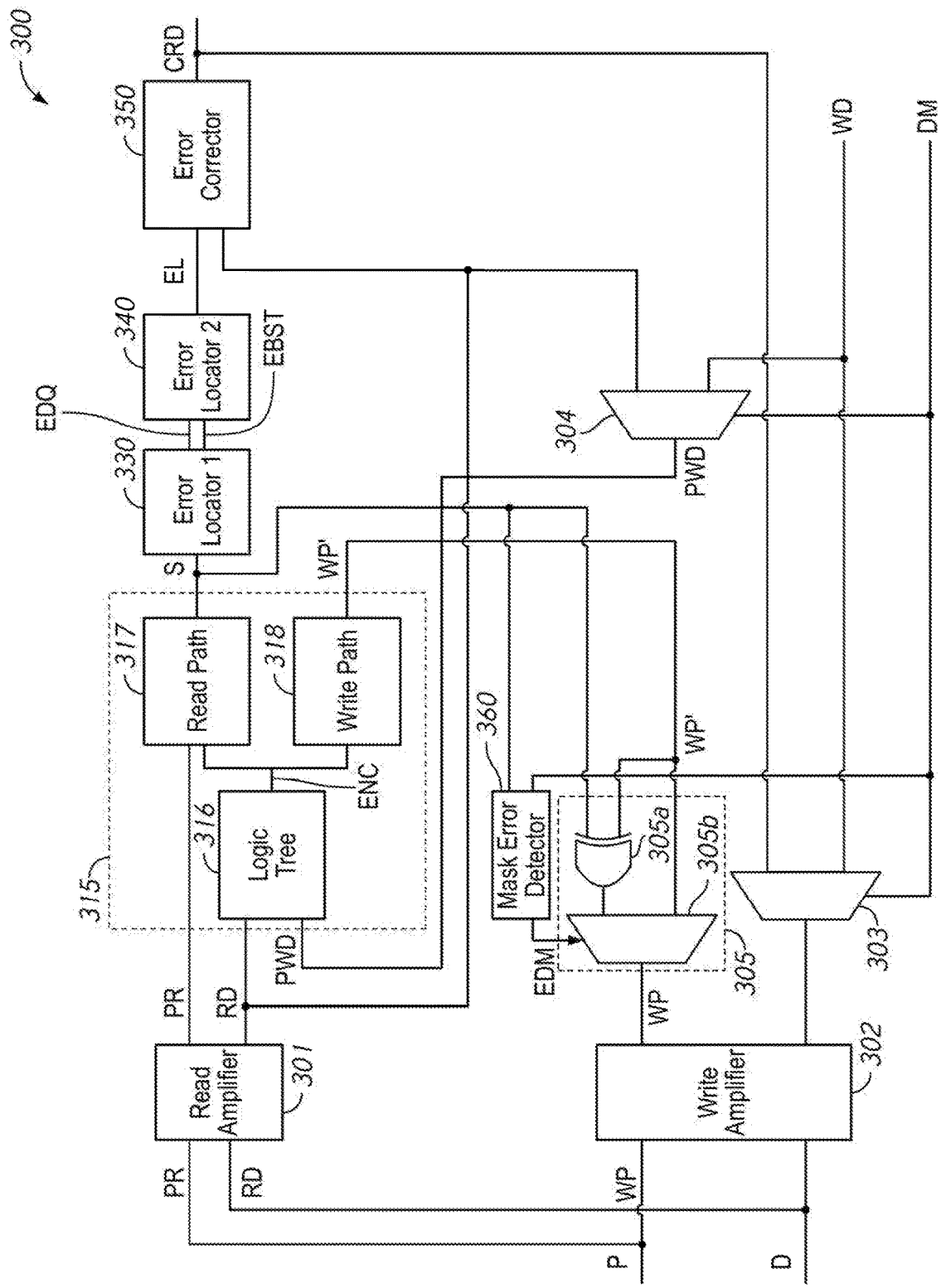
FIG. 3 is a schematic diagram of an error correction code (ECC) control circuit according to some embodiments of the present disclosure

FIG. 3 is a schematic diagram of an error correction code (ECC) control circuit according to some embodiments of the present disclosure. The ECC control circuit 300 of FIG. 3 may, in some embodiments, be included in the ECC control circuit 120 of FIG. 1 and/or 220 of FIG. 2. As part of a write operation, the ECC control circuit 300 may receive write data bits WD and may generate written parity bits WP. These may be provided to the memory array as data bits D and parity bits P and may be stored in the memory array for later retrieval. As part of a read operation, the ECC control circuit 300 may receive data D from the memory array as read data RD and parity bits P as read parity bits PR and may generate corrected data bits CRD based on the bits RD and PR. The corrected data bits CRD may then be provided to an I/O circuit (e.g., 122 of FIG. 1) and read off of the device.

During an example read operation, the read amplifier 301 is activated to amplify the read parity bits PR and read data RD. The amplified bits PR and RD are provided to an encoder/syndrome generator circuit 315. The encoder/syndrome generator circuit 315 provides syndrome bits S based on the read bits RD and PR. In some embodiments, the number of syndrome bits S may match the number of parity bits PR. The syndrome bits S are provided to an error locator circuit 330.

The error locator circuit 330 provides a first set of error determination signals EBST and a second set of error determination bits EDQ based, in part, on the syndrome bits S. In some embodiments, data provided to/received at the DQ terminals may be organized into bursts on a number of different DQ terminals (e.g., a burst of 8 bits on each of 16 different DQ terminals for 128 total bits). The first set of error determination signals EBST may indicate a location of an error bit within a burst. In some embodiments, there may be a bit for each of the bits in the burst, and the signals EBST may be provided in common to the DQ terminals. The second set of error determination signals EDQ may indicate which of the DQ terminals the error bit is being provided to. In some embodiments, there may be a bit for each DQ terminal, and the signals EDQ may be provided in common with the burst bits.

The error determination signals EBST and EDQ may be provided to a second error locator circuit 340. The second error locator circuit 340 may decode the signals EBST and EDQ to identify a location of an error bit in the read data RD. The location of the error bit may be specified by an error location signal EL. In some embodiments, there may be a number of bits of the error location signal EL based on the number of bits of the read data RD, with each bit of the error location signal EL associated with a bit of the read data RD.

The error position signal EL is provided to error corrector circuit 350. The error corrector circuit 350 also receives the read data RD and corrects one or more error bits in the RD based on the error location signal EL. For example, if an nth bit of the error location signal EL is at a high logical level, then the error corrector circuit 350 may change a state of the nth read bit RD. The error corrector circuit 350 may provide the corrected read data CRD. The corrected read data CRD may be provided to the DQ pads and read off of the device.

In an example write operation to the memory device, the ECC control circuit 300 may receive write data WD and a data mask signal DM. A first multiplexer 303 may synthesize the write data WD and the corrected read data CRD based on the data mask signal DM. The first multiplexer 303 may provide the data D to a write amplifier 302 which provides the amplified data D to the memory array. In some embodiments, the data mask signals DM may be associated with the different burst bits received at the data terminals. When one (or more) of the data mask bits DM is active, then the write data WD associated with that data mask bit may be replaced by the corrected read data CRD in the data D.

A second multiplexer 304 may synthesize the write data WD and the read data RD based on the data mask signal. The second multiplexer 304 may provide parity write data PWD. The parity write data PWD may be provided to an encoder/syndrome generator circuit 315, which may encode the parity write data PWD into the write parities WP'. The write parities WP' are provided to a converter circuit 305 which generates the write parities WP, which are written to the memory array as the parity bits P.

The converter circuit 305 includes an XOR logic gate 305a and a third multiplexer 305b. The XOR logic gate 305a has input terminals coupled to the syndrome bits S and the write parity bits WP'. The XOR logic gate 305a provides an output which is at a high logical level when the syndrome bite S is different from the associated write parity bit WP'. The third multiplexer 305b provides either the output of the XOR logic gate 305a or the write parity WP' as the write parity WP. The multiplexer 305b choses the source of the write parity WP bits based on a conversion signal EDM. When the conversion signal EDM is active, the write parity WP is the output of the XOR gate 305a. When the conversion signal EDM is inactive, the signal WP' is provided as the signal WP.

A mask error detector circuit 360 provides the signal EDM based on the syndrome bits S and on the data mask DM. The mask error detector circuit 360 may determine whether or not burst data to which an error bit belongs and burst data masked by the data mask signal DM are coincident. If they are coincident, then the signal EDM may be activated. If they are not coincident, the signal EDM may remain inactive.

The encoder/syndrome generator circuit 315 includes a logic tree 316 which receives either the read data RD (as part of a read operation) or parity data PWD. The logic tree 316 may encode the received data into one or more encoded bits ENC. Both the read data RD and the parity write data PWD may have a number of bits. In some embodiments, the read data RD and the parity write data PWD may have a same number of bits. The number of bits of RD and PWD may be based on the read/write word length of the memory. For example, the read data RD and the parity write data PWD may each include 128 bits. The encoded bits may include a number of bits. In some embodiments, the number of encoded bits ENC may generally be smaller than the number of input data bits (e.g., PWD or RD). For example, if the input data PWD or RD includes 128 bits, there may be 16 encoded bits. Accordingly, the input data PWD or RD may be organized into sets, each of which is associated with a single encoded bit ENC. For example, 128 bits of input data may be organized into 8 sets of 16 bits, each of which is associated with one encoded bit ENC. A logic tree 316 is discussed in more detail in FIG. 4.

The encoded bits ENC are provided in common to a read path 317 and a write path 318. The write path 318 may generally store the encoded bits ENC and provide them as the write parity bits WP'. The write parity bits WP' may be used to generate the write parity bits WP which may then be stored in the memory. The read path 317 may receive the encoded bits ENC from the logic tree 316 and may also receive the read parity bits PR. The read path 317 may store the read parity bits PR and then may compare them to the encoded bits ENC. Since the read parity bits PR may represent a previous set of encoded bits associated with the data when it was written to memory. When the data and parity bits are read from the memory and the read data RD is fed through the logic tree 316 again, the encoded bits ENC should generally match the read parity bits PR (e.g., assuming no errors). Accordingly, the read path 317 may include logic which compares the read parity bits PR to the encoded bits ENC and may generate syndrome bits S based on that comparison.

While not shown in FIG. 3 for clarity, the various components may be activated by one or more timing and control signals, which may help to indicate if a write or read operation is being performed. For example, the encoder/syndrome generator circuit 315 may receive a write state signal which may be at a first level if a write operation is being performed and at a second level if a read operation is being performed. The components of the ECC circuit 300 may also receive various timing signals which may be provided to various components in a sequence to trigger the activations of various components in proper order to ensure that write and read operations are properly executed.

Figure 4A:
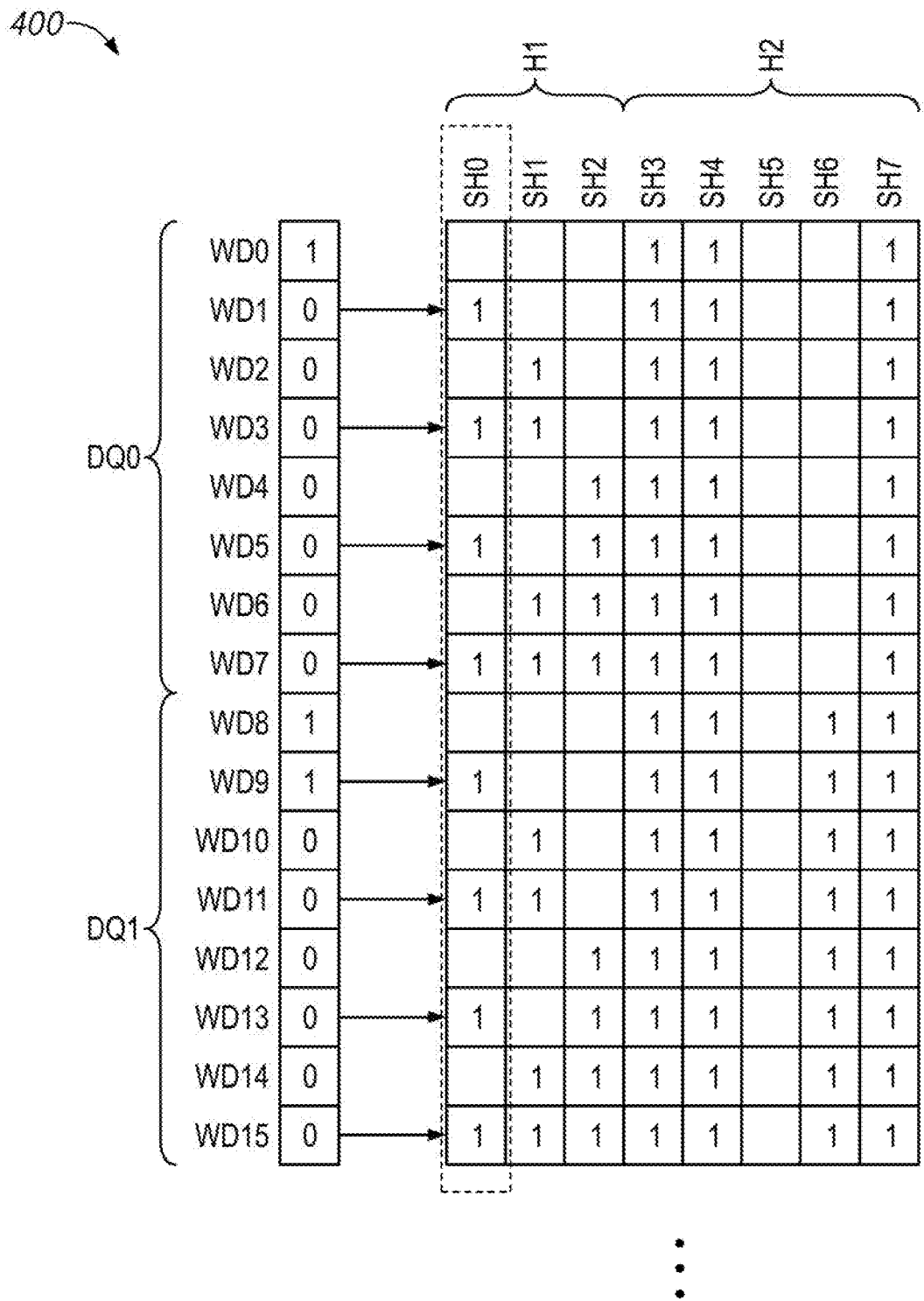
FIGS. 4A to 4C are schematic diagrams of a logic tree according to some embodiments of the present disclosure.
Figure 4B:
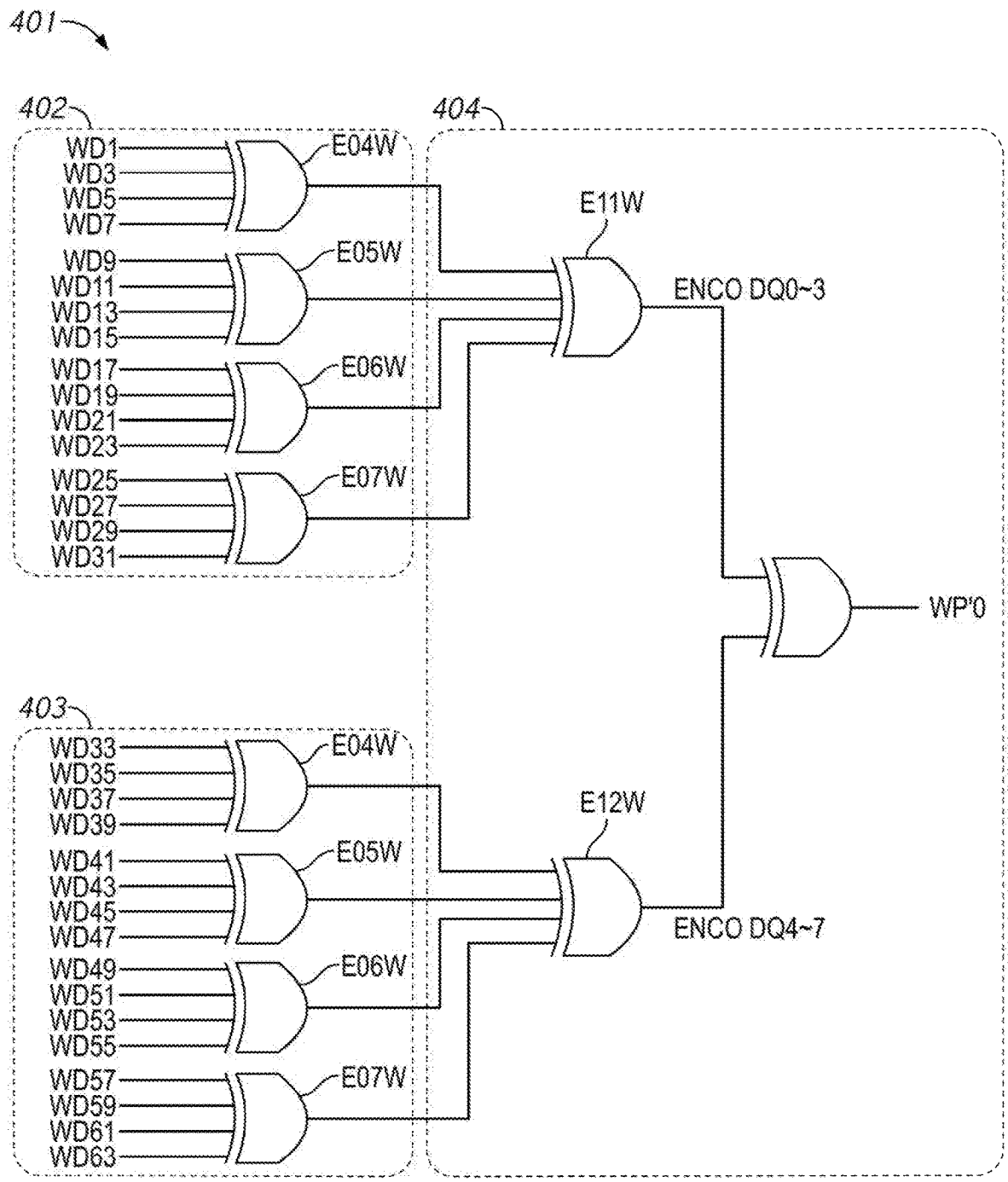
Figure 4C:
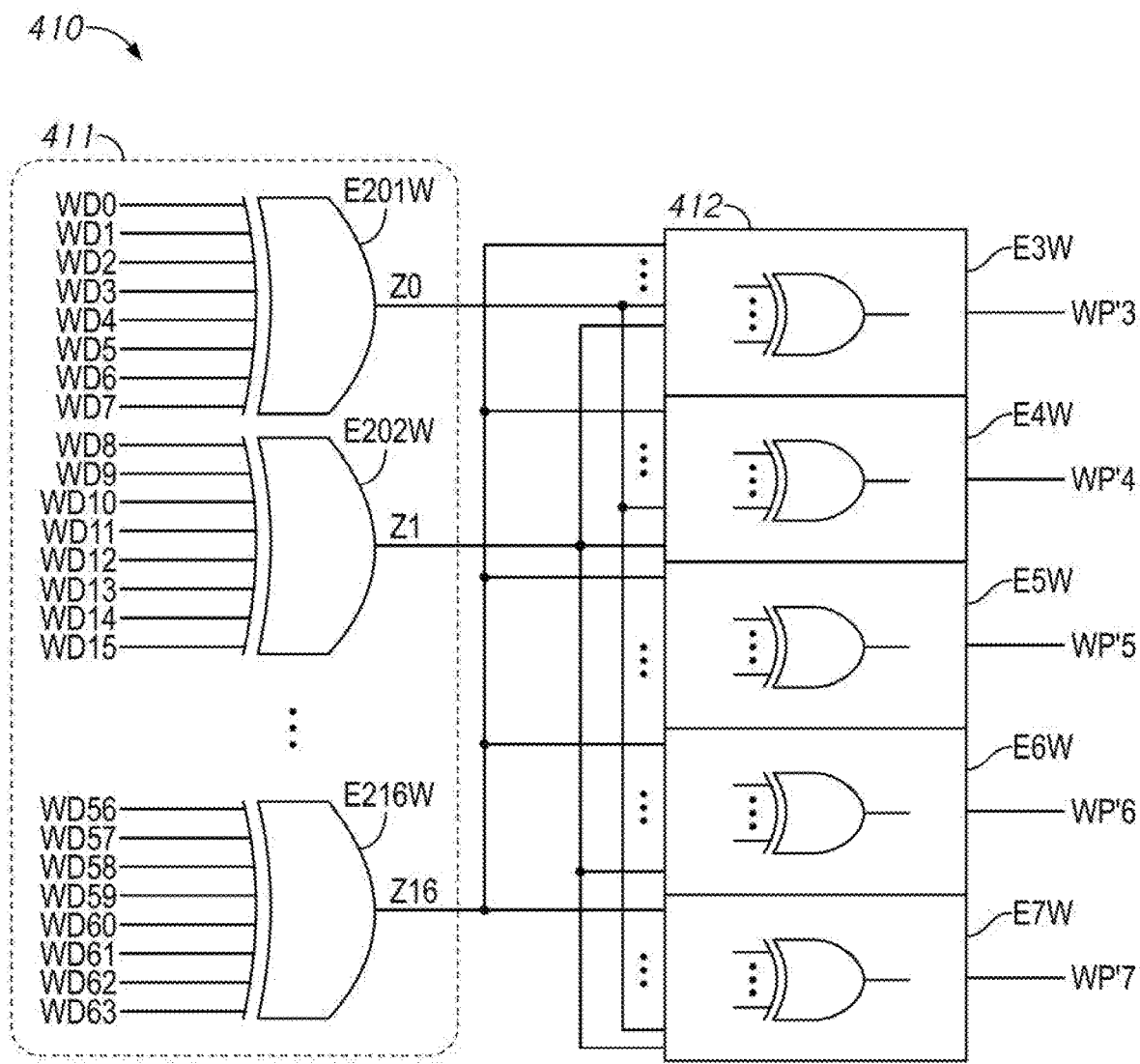

FIGS. 4A to 4C are schematic diagrams of a logic tree according to some embodiments of the present disclosure. FIG. 4A shows a chart 400 which depicts a particular arrangement of logic for generating an encoded bit. FIGS. 4B and 4C show portions 401 and 410 of a logic tree which may be used to implement all or part of the chart 400. The portions 401 and 410 may, in some embodiments, be included in the logic tree 316 of FIG. 3. It should be understood that other logical arrangements and logic trees may be used in other example embodiments.

The logic chart 400 and circuits 401 and 410 may represent a portion of a logic tree which is used as part of a write operation to generate the write parities (e.g., WP' of FIG. 3). In some embodiments, the logic circuits 401 and 410 may also be used to generate the syndrome bits during a read operation. In some embodiments, a portion of the circuits 401 and 410 may be shared between read and write operations, while another portion of the logic circuits 401 and 410 may not be shared.

The chart 400 shows write bits arranged in a column along the left side. Each of the rows represents one of the write bits WD provided on the data terminals DQ. The write bits WD are arranged to correspond to data terminals DQ, and the bits which are received as a burst on that data terminal. In the embodiment shown in FIGS. 4A-4C, there may be 8 data terminals each of which may receive a burst of 8 bits. Other numbers of terminals and bits are possible in other embodiments. The columns of the chart 400 SH0 to SH7 show different syndromes which may be used as encoding for the data bits to generate the parity bits. The columns are arranged into a first determinant H1 which are associated with the logic circuits 401 while the columns arranged in the second determinant H2 are associated with the logic circuits 410.

The logic circuits 401 include a first block 402 of logic circuits and a second block 403 of logic circuits. The blocks 402 and 403 receive the write data bits WD which are indicated with a '1' in the first column SH0 of the chart 400. The write data bits are grouped together in groups of 4 (e.g., WD1, WD3, WD5 and WD7) and provided to four input terminals of an exclusive or (XOR) gate. The XOR gate provides an output based on the four inputs. Four such XOR gates (e.g., coupled to 16 WD bits) each provide an output to an XOR gate in a third block 404. The second block 403 is similar to the first block 402, and has four XOR gates coupled to 16 write data WD bits, and provides four outputs to the inputs of an XOR gate in the third block 404. The third block 404 includes two four-input XOR gates coupled to the four outputs of the first block 402 and the four outputs of the second block 403 respectively. In turn these two XOR gates provide outputs which are XOR'd together to produce the write parity bit WP'0, corresponding to the connections of the column SH0 of the chart 400. Similar logic to the circuits 401 may be used to generate the parity bits WP'1 and WP'2 for the next two columns SH1 and SH2 of the chart 400.

The circuits 410 show example logic circuits which may be used to generate the parity bits WP'3 to WP'7 which are associated with the columns SH3 to SH7 of the chart 400. In the circuits 401, there are set number of inputs (e.g., 32 bits) which are active (e.g., marked with a 1) in each column of the chart 400. However, in the circuits 410, there may be different numbers of inputs in the different columns. The circuits 410 include a first block 411 which includes a number of XOR gates which are coupled to the different input bits WD as indicated by the chart 400. The outputs of the XOR gates of the first block 411 are in turn provided as inputs to the XOR gates 412. Each of the XOR gates 412 provide one of the write parity bits WP'.

Figure 5:
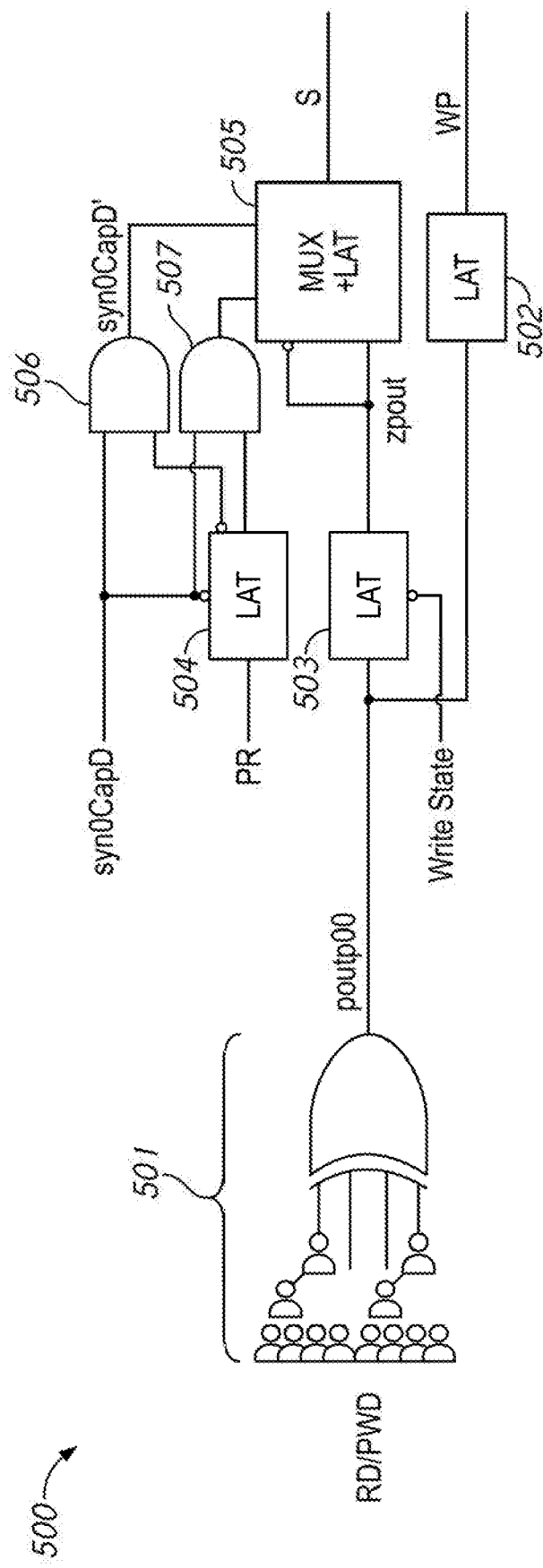
FIG. 5 is a schematic diagram of an encoder/syndrome generator circuit according to some embodiments of the present disclosure.

FIG. 5 is a schematic diagram of an encoder/syndrome generator circuit according to some embodiments of the present disclosure. The encoder/syndrome generator circuit 500 may, in some embodiments, be included in the encoder/syndrome circuit 315 of FIG. 3. The encoder/syndrome circuit 500 may have components which function in a manner similar to an encoder circuit and components which function in a manner similar to a syndrome generator.

The encoder/syndrome generator circuit 500 of FIG. 5 may represent the circuits and logic which are used for a single parity bit's worth of data. For example, the encoder/syndrome circuit 500 may receive 16 bits of data and generate a single parity bit based on those 16 data bits. Accordingly, the encoder/syndrome circuit 500 may represent a portion of an overall encoder/syndrome circuit 500, and the circuit 500 may be repeated to handle increased data bus width. For example, if 16 data bits are associated with one parity bit, and the data bus includes 128 bits, then the circuit 500 may be repeated 8 times. Other numbers of data bits and parity bits, and other numbers of repeats of the circuit 500 may be used in other examples.

The encoder/syndrome generator circuit 500 includes a logic tree 501, which receives read data (e.g., RD) or write data (e.g., PWD) and provides an encoded bit poutp00 based on the received data. The logic tree 501 may be a tree of XOR logic gates, which may be coupled together in different patterns to generate the encoded bits (e.g., similar to the logic chart 400 of FIG. 4). The encoded bit poutp00 (e.g., which may be one of the encoded bits ENC of FIG. 3) may represent encoded information based on the received data RD/PWD.

The encoded bit poutp00 is provided to a first latch 502 which stores the value of the encoded bit poutp00. The first latch 502 may, in some embodiments, be included in the write path 318 of FIG. 3. The first latch 502 provides a write parity bit WP which has the value of the encoded bit poutp00. Accordingly, in an example write operation, the logic tree 501 may receive write data (WD) and generate an encoded bit poutp00 which may be saved into the latch 502 and provided as the write parity bit WP. The write data WD and associated WP bit may then be written to the memory array. The write parity bit WP provided by the latch 502 may be the write parity bit WP' of FIG. 3.

The encoder/syndrome circuit 500 may also be used as a syndrome generator circuit as part of a read operation. The logic tree 501 may receive read data (e.g., RD) and provide and encoded bit poutp00. The encoded bit poutp00 may be saved in a second latch 503. The second latch 503, logic gates 506 and 507 and multiplexer/latch 505 may, in some embodiments, be included in a read path such as the read path 317 of FIG. 3. In some embodiments, the logic tree 501 may be reconfigured when used as part of read and write operations. For example, the read data RD may be coupled through a first sequence of logic gates of the logic tree 501, while the write data PWD may be coupled through a second sequence of logic gates of the logic tree 501. In some embodiments, some of the individual logic gates may be shared between the first and the second sequence.

In some embodiments, the second latch 503 may be coupled to a control signal such as the write state signal Write State, which may be used to determine if the second latch 503 should be active (e.g., store the value poutp00) or not. For example, the signal Write State may be at an active level when a write operation is being performed, and at an inactive level when a write operation is not being performed. The second latch 503 may have an inverting enable terminal (e.g., an inverting clock terminal) coupled to the signal Write State, which activates the second latch 503 when the signal Write State is inactive. The second latch 503 may provide the stored encoded bit poutp00 as the encoded bit zpout.

A multiplexer latch 505 may store the encoded bit zpout and may store an inverse of the encoded bit zpout (e.g., zpoutF) provided by the latch 503. The multiplexer latch 505 may provide either the encoded bit zpout or the inverse zpoutF as the syndrome bit S, based on the state of a timing signal syn0CapD and the read parity bit PR. A two bit select signal syn0CapD' prime is provided with a state based on the read parity bit PR when the timing signal syn0CapD is active. The multiplexer latch 505 provides the syndrome bit S based on the encoded bit zpout based on the state of syn0CapD' when syn0CapD' is provided.

A latch circuit 504 may store the value of the read parity bit PR responsive to the state of the timing signal syn0CapD. The timing signal syn0CapD may be coupled to an inverting clock terminal of the latch 504. Accordingly, when the timing signal syn0CapD is inactive (e.g., at a low logical level), the read parity bit PR may be stored in the latch 504. The latch may provide the value of the saved read parity bit PR to an input terminal of an AND gate 507. The other input terminal of the AND gate 507 may be coupled to the timing signal syn0CapD. The latch 504 also provides an inverse of the stored bit to the input terminal of AND gate 506, which has another input terminal coupled to the timing signal syn0CapD. Accordingly, the output of the gate 506 may be at a high logical level when the timing signal syn0CapD is at a high logical level and the stored parity bit PR is at a low logical level (e.g., since the AND gate 506 receives the inverse of the stored parity bit PR). The output of the gate 507 may be at a high logical level when both the timing signal syn0CapD is at a high logical level and when the parity bit PR stored in the latch is at a high logical level. The outputs of the AND gates 506 and 507 may be a select signal syn0CapD'.

The multiplexer latch 505 may provide the syndrome bit based on the state of the stored bits zpout (and its inverse) and the select signal syn0CapD'. The select signal syn0CapD' may have a first bit which is the output of the AND gate 506 and a second bit which is the output of the AND gate 507. Since the two AND gates both depend on the state of the bit stored in the latch 504, only one of the two bits of the signal syn0CapD' may be active (e.g., at a high level) at one time. When the first bit of the signal syn0CapD' (e.g., the output of AND gate 506) is at a high logical level (e.g., indicating that the stored read parity PR is at a low logical level), the multiplexer latch 505 may provide the syndrome bit S at a low logical level if the stored bit zpout is at a low logical level, and may provide the syndrome bit S at a high logical level if the stored bit zpout is at a high logical level. When the second bit of the signal syn0CapD' (e.g., the output of AND gate 507) is at a high logical level (e.g., indicating that the stored read parity PR is at a high logical level), the multiplexer latch 505 may provide the syndrome bit S at a low logical level if the stored bit zpout is at a high logical level and may provide the syndrome bit S at a high logical level if the stored bit zpout is at a low logical level. In this manner, the multiplexer latch 503 may work in a manner analogous to an exclusive or (XOR) logical gate and the syndrome bit S may be at a low logical level when the bits PR and zpout have the same state and may be at a high logical level when the bits PR and zpout do not match.

Figure 6:
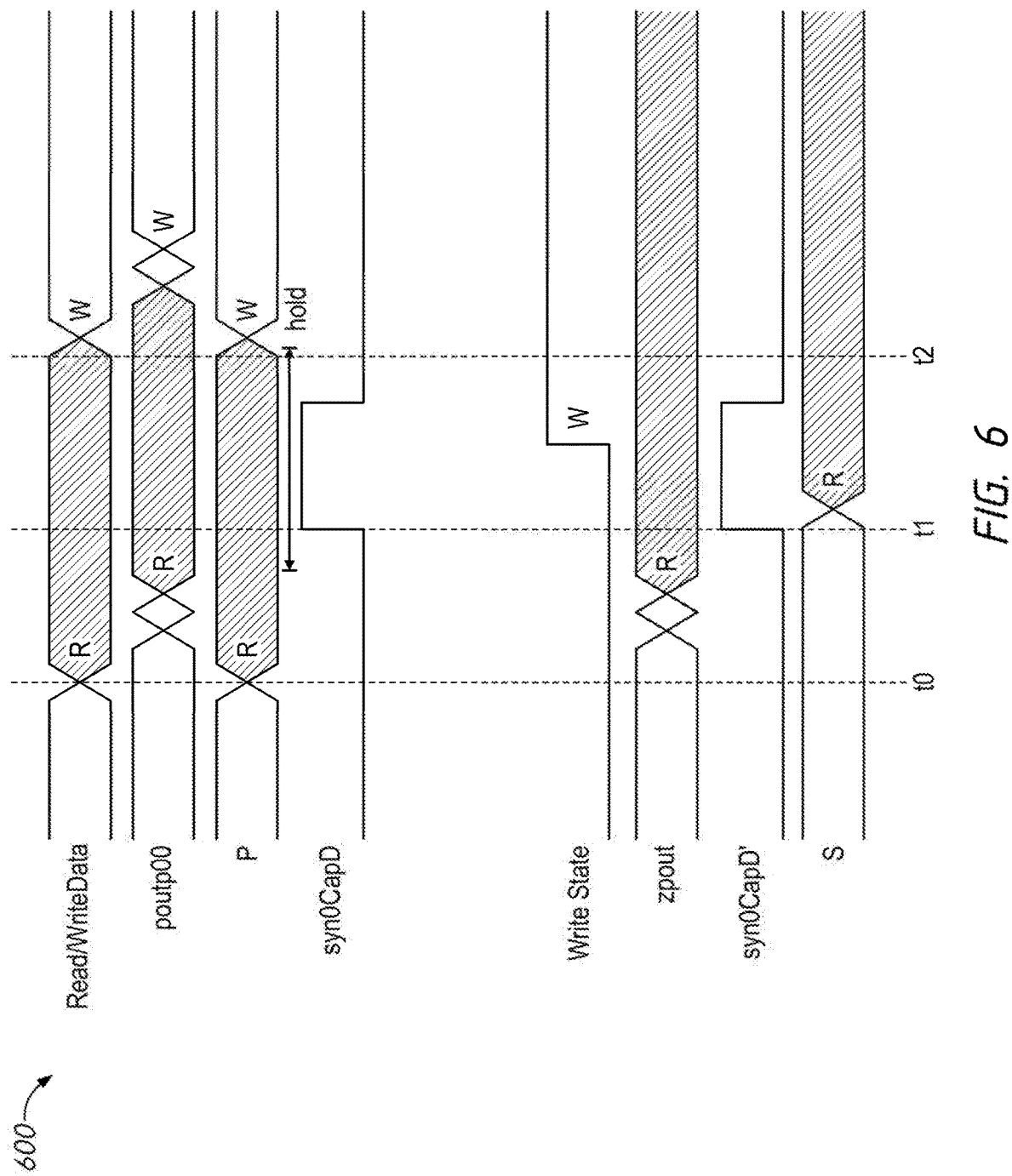
FIG. 6 is a timing diagram of read and write operations in a syndrome/encoder generator circuit according to some embodiments of the present disclosure.

FIG. 6 is a timing diagram of read and write operations in a syndrome/encoder generator circuit according to some embodiments of the present disclosure. The timing diagram 600 may, in some embodiments, represent the operation of the syndrome/encoder circuit 315 of FIG. 3 and/or 500 of FIG. 5. Several of the traces in the timing diagram 600 represent signals which may be active as both part of a read operation or a write operation. These signals are represented with an R and shaded to indicate that they are being used to carry data as part of a read operation, and are marked with a W and un-shaded to indicate that they are used as part of a write operation.

The first trace of the timing diagram 600 represents read or write data received at the logic tree (e.g., 316 of FIG. 3, 400 of FIG. 4, and/or 501 of FIG. 5). For example, when the read/write data is marked W it may represent the bits write data PWD, while when it is marked R it may represent read data RD. The second trace represents the encoded bit (e.g., poutp00) which is provided by the logic tree. At an initial time t0, the memory may switch from a write operation to a read operation. As may be noted from the timing diagram, there is a slight delay after the read operation begins (and the read/write data switches to read data R) before the value of poutp00 switches to a read output R. This delay may account for the time it takes for the logic tree to produce and provide the encoded bit from the read data RD.

The third trace of the timing diagram 600 represents the parity bit P read from or written to the memory. When the trace indicates W, the parity trace may represent the written parity WP. When the trace indicates R, the parity trace may represent the read parity PR. At the time t0, the read parity may switch to the R state to indicate that the parity bits are the read parity PR. Since the data (e.g., read data RD) and the parity are read out of the memory array together, the data and the parity may generally switch to read information at about the same time (e.g., at the initial time t0).

The fourth trace represents the timing signal syn0CapD. At the time t0 (and before), the timing signal syn0CapD may be at an inactive level (e.g., because a read operation is not being performed). At a time t1, which is after the time t0, the timing signal syn0CapD may switch to an active level (e.g., to a high logical level) to activate the circuits of the read path.

The fifth trace represents the signal Write State, which is at an inactive level (since a write operation is not being performed) between the times t0 and t1. The signal Write State may rise to an active level after the time t1 (but before a time t2) to prepare the encoder/syndrome generator circuit for a subsequent write operation, which begins after the time t2.

The sixth trace represents a value zpout, which is the encoded value poutp00 after it has been saved in a latch along the read path (e.g., in latch 503 of FIG. 5). The value of zpout may switch to a read state R between the times t0 and t1 (e.g., at about the time the value poutp00 switches to the read state R). The value zpout may continue to be a read state even after the value of poutp00 switches the write state W (e.g., after the time t2) since the value of the signal Write State rises to an active level, which prevents the latch which holds zpout from latching a new value.

The seventh trace represents the signal syn0CapD' which is provided along the read path to help determine the state of the output syndrome bits S. The signal syn0CapD' goes from inactive to active at time t1 (e.g., at about the same time syn0CapD becomes active) and returns to inactive between times t1 and t2 (e.g., at about the same time that synCapD becomes inactive). The final trace represents the state of the syndrome bit S, which switches to a valid output value (e.g., the R state) after the time t1 (but before the time t2).

The timing chart 600 shows a bar labelled 'hold' which may represent the time that various latches are storing valid read data (e.g., are in the R state) and the timing signal syn0CapD may be used to have the circuit provide a valid syndrome bit S. The hold time may extend from slightly before the time t1 (e.g., from about when poutp00 switches to the R state) to just after the time t2 (e.g., from about when the parity bit P stops having a valid state R to switch to the write state W). Since the parity bit is held in a pathway separate from the write state, the stored value of the parity bit may remain valid even when the signal WriteState activates, which may allow for an increased hold time.

Of course, it is to be appreciated that any one of the examples, embodiments or processes described herein may be combined with one or more other examples, embodiments and/or processes or be separated and/or performed amongst separate devices or device portions in accordance with the present systems, devices and methods.

Finally, the above-discussion is intended to be merely illustrative of the present system and should not be construed as limiting the appended claims to any particular embodiment or group of embodiments. Thus, while the present system has been described in particular detail with reference to exemplary embodiments, it should also be appreciated that numerous modifications and alternative embodiments may be devised by those having ordinary skill in the art without departing from the broader and intended spirit and scope of the present system as set forth in the claims that follow. Accordingly, the specification and drawings are to be regarded in an illustrative manner and are not intended to limit the scope of the appended claims.

What is claimed is:

1. An apparatus comprising:
   a logic tree configured to receive a plurality of data bits and provide an encoded bit based on the plurality of data bits;
   a read path including:
      a first latch configured to store a parity bit read from a memory array responsive to a timing signal as part of a read operation;
      logic gates configured to provide a select signal based, in part, on a value of the parity bit stored in the first latch when the timing signal is active; and
      a multiplexer latch configured to receive the encoded bit from the logic tree and configured to provide a syndrome bit which has either the same state as the encoded bit or an opposite state of the encoded bit, based on the select signal provided by the logic gates.

2. The apparatus of claim 1, further comprising a write path including a second latch configured to store the encoded bit, wherein the write path is configured to provide the encoded bit as a parity bit to the memory array as part of a write operation.

3. The apparatus of claim 1, wherein during the read operation the plurality of data bits include a plurality of data bits read from the memory array.

4. The apparatus of claim 1, wherein the select signal has a first state if the parity bit stored in the first latch is at a high logical level and a second state if the parity bit stored in the first latch is at a low logical level.

5. The apparatus of claim 1, further comprising a second latch configured to store the encoded bit responsive to a write state signal being inactive and provide the stored encoded bit to the multiplexer latch.

6. The apparatus of claim 1, wherein errors in the plurality of data bits are located and corrected based on the syndrome bit.

7. An apparatus comprising:
   a logic tree configured to receive a plurality of data bits and provide an encoded bit based on the plurality of data bits;
   a first latch configured to receive the encoded bit and provide it as a write parity bit for storage in a memory array as part of a write operation;
   a second latch configured to receive a read parity bit from the memory array as part of a read operation and store the read parity bit responsive to a timing signal at an inactive level;
   logic gates configured to provide a select signal with a value based, in part, on a value of the read parity bit stored in the second latch when the timing signal is at an active level; and
   a multiplexer latch configured to store the encoded bit from the logic tree and provide a syndrome bit with a value based on the encoded bit stored in the multiplexer latch and the value of the select signal provided by the logic gates as part of a read operation.

8. The apparatus of claim 7, further comprising a third latch configured to store the encoded bit responsive to a write state signal being inactive, wherein the third latch is configured to provide the stored parity bit to the multiplexer latch.

9. The apparatus of claim 8, wherein the multiplexer latch is configured to store the stored encoded bit from the third latch and an inverse of the stored encoded bit from the third latch, and to provide the stored encoded bit or the inverse of the stored encoded bit as the syndrome bit based on the value of the select signal.

10. The apparatus of claim 7, wherein the logic gates comprise:
   a first logic gate with a first input terminal coupled to the timing signal and a second input terminal coupled to an inverse of the parity bit stored in the second latch; and
   a second logic gate with a first input terminal coupled to the timing signal and a second input terminal coupled to the parity bit stored in the second latch,
   wherein the first and the second logic gate provide the select signal.

11. The apparatus of claim 7, wherein the logic tree comprises a plurality of logic gates, and wherein a first portion of the plurality of logic gates are used during the write operation and wherein a second portion of the plurality of logic gates used during the read operation.

12. The apparatus of claim 7, wherein as part of the write operation the plurality of data bits and the parity bit are written to the memory array and wherein as part of the read operation the plurality of data bits and the parity bit are read from the memory array and corrected based on the syndrome bit.

13. An apparatus comprising:
   a memory array configured to store data bits and parity bits; and
   an error correction code (ECC) circuit configured to receive the data bits and the parity bits from the memory array as part of a read operation, wherein the ECC circuit comprises:
      a logic tree configured to receive the data bits and generate a plurality of encoded bits each based on a respective subset of the data bits; and
      a read path including:
         a plurality of first latches configured to store the parity bits read from the memory array responsive to a timing signal in an inactive state;
         a plurality of first latches configured to store the parity bits read from the memory array responsive to a timing signal in an inactive state,
   wherein the ECC circuit is configured to provide a plurality of syndrome bits each with a value based on one of the plurality of encoded bits and an associated one of the plurality of select signals.

14. The apparatus of claim 13, further comprising an input/output circuit configured to receive write data bits as part of a write operation at a plurality of input/output terminals and provide read data bits read from the memory array to the input/output terminals as part of a read operation.

15. The apparatus of claim 13, wherein the ECC circuit is configured to detect and correct errors in the received data bits based on the syndrome bits.

16. The apparatus of claim 13, wherein the FCC circuit is further configured to receive the data bits as part of a write operation, wherein the logic tree is configured to receive the data bits and provide the plurality of encoded bits based on the data bits, and wherein the ECC circuit further comprises a write path configured to provide the encoded bits as parity bits.

17. The apparatus of claim 13, wherein the read path receives the plurality of encoded bits in common with the write path.

18. The apparatus of claim 13, wherein the read path includes a plurality of second latches configured to store respective ones of the plurality of encoded bits responsive to a write state signal in an inactive state.

* * * * *